US009007077B2

(12) United States Patent
El-Essawy et al.

(10) Patent No.: US 9,007,077 B2
(45) Date of Patent: Apr. 14, 2015

(54) FLEXIBLE CURRENT AND VOLTAGE SENSOR

(75) Inventors: Wael El-Essawy, Austin, TX (US); Alexandre Peixoto Ferreira, Austin, TX (US); Thomas Walter Keller, Austin, TX (US); Karthick Rajamani, Austin, TX (US); Juan C. Rubio, Austin, TX (US); Michael A. Schappert, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 13/596,658

(22) Filed: Aug. 28, 2012

(65) Prior Publication Data

US 2014/0062459 A1   Mar. 6, 2014

(51) Int. Cl.
*G01R 27/08* (2006.01)
*G01R 15/20* (2006.01)
*G01R 1/22* (2006.01)

(52) U.S. Cl.
CPC ................ *G01R 15/205* (2013.01); *G01R 1/22* (2013.01); *G01R 15/207* (2013.01)

(58) Field of Classification Search
CPC ...... G01R 33/02; G01R 33/09; G01R 33/093; G01R 19/00; G01R 19/0092; G11B 5/3932; G11B 5/372; G11B 5/376
USPC .................. 323/713, 244–252, 260, 344, 127; 323/117 R, 117 H; 324/713, 244–252, 260, 324/344, 127, 117 R, 117 H
See application file for complete search history.

(56) References Cited

U.S. PATENT DOCUMENTS

| | | | |
|---|---|---|---|
| 4,005,380 A | | 1/1977 | Heilmann et al. |
| 4,266,189 A | * | 5/1981 | Karlin et al. ............. 324/117 H |

(Continued)

FOREIGN PATENT DOCUMENTS

| | | |
|---|---|---|
| CN | 101329370 A | 12/2008 |
| CN | 201654106 U | 11/2010 |

(Continued)

OTHER PUBLICATIONS

U.S. Appl. No. 13/024,199, filed Feb. 9, 2011, Carpenter, et al.

(Continued)

*Primary Examiner* — Tung X Nguyen
*Assistant Examiner* — Son Le
(74) *Attorney, Agent, or Firm* — Mitch Harris, Atty at Law, LLC; Andrew M. Harris; William J. Stock

(57) ABSTRACT

A flexible current and voltage sensor provides ease of installation of a current sensor, and optionally a voltage sensor in application such as AC branch circuit wire measurements, which may require installation in dense wiring conditions and/or in live panels where insulating gloves must be worn. The sensor includes at least one flexible ferromagnetic strip that is affixed to a current sensing device at a first end. The second end is secured to the other side of the current sensing device or to another flexible ferromagnetic strip extending from the other side of the current sensing device to form a loop providing a closed pathway for magnetic flux. A voltage sensor may be provided by metal foil affixed to the inside of the flexible ferromagnetic strip. A clamp body, which can be a spring loaded handle operated clamp or a locking fastener, can secure the ferromagnetic strip around the wire.

9 Claims, 5 Drawing Sheets

(56) References Cited

U.S. PATENT DOCUMENTS

| | | | |
|---|---|---|---|
| 4,378,525 A | 3/1983 | Burdick | |
| 4,558,276 A | 12/1985 | Comeau et al. | |
| 5,473,244 A | 12/1995 | Libove et al. | |
| 5,610,512 A | 3/1997 | Selcuk | |
| 5,867,020 A | 2/1999 | Moore et al. | |
| 6,008,634 A | 12/1999 | Murofushi et al. | |
| 6,414,474 B1 * | 7/2002 | Gohara et al. | 324/117 H |
| 6,522,509 B1 | 2/2003 | Engel et al. | |
| 6,654,219 B1 | 11/2003 | Romano et al. | |
| 6,661,239 B1 | 12/2003 | Ozick | |
| 6,703,842 B2 | 3/2004 | Itimura et al. | |
| 6,708,126 B2 | 3/2004 | Culler et al. | |
| 6,825,649 B2 | 11/2004 | Nakano | |
| 6,940,291 B1 | 9/2005 | Ozick | |
| 7,068,045 B2 | 6/2006 | Zuercher et al. | |
| 7,098,644 B1 | 8/2006 | Denison | |
| 7,148,675 B2 | 12/2006 | Itoh | |
| 7,227,348 B2 | 6/2007 | Sorenson | |
| 7,230,413 B2 | 6/2007 | Zhang et al. | |
| 7,265,533 B2 | 9/2007 | Lightbody et al. | |
| 7,315,161 B2 | 1/2008 | Zribi et al. | |
| 7,330,022 B2 | 2/2008 | Bowman et al. | |
| 7,474,088 B2 | 1/2009 | Bowman et al. | |
| 7,493,222 B2 | 2/2009 | Bruno | |
| 7,546,214 B2 | 6/2009 | Rivers, Jr. et al. | |
| 7,622,912 B1 | 11/2009 | Adams et al. | |
| 7,714,594 B2 | 5/2010 | Ibuki et al. | |
| 7,719,257 B2 | 5/2010 | Robarge et al. | |
| 7,719,258 B2 | 5/2010 | Chen et al. | |
| 7,847,543 B2 | 12/2010 | Grno | |
| 7,936,164 B2 | 5/2011 | Doogue et al. | |
| 7,990,133 B2 | 8/2011 | Dockweiler | |
| 2004/0227503 A1 | 11/2004 | Bowman | |
| 2004/0257061 A1 | 12/2004 | George de Buda | |
| 2005/0156587 A1 | 7/2005 | Yakymyshyn et al. | |
| 2006/0087777 A1 | 4/2006 | Bruno | |
| 2007/0058304 A1 | 3/2007 | Parker et al. | |
| 2008/0077336 A1 | 3/2008 | Fernandes | |
| 2008/0079437 A1 | 4/2008 | Robarge et al. | |
| 2009/0105973 A1 | 4/2009 | Choi et al. | |
| 2010/0001715 A1 | 1/2010 | Doogue et al. | |
| 2010/0231198 A1 | 9/2010 | Bose et al. | |
| 2010/0264944 A1 | 10/2010 | Rupert | |
| 2010/0271037 A1 | 10/2010 | Blakely | |
| 2010/0283487 A1 | 11/2010 | Juds et al. | |
| 2011/0084688 A1 | 4/2011 | Sorensen | |
| 2012/0200293 A1 * | 8/2012 | Carpenter et al. | 324/252 |
| 2012/0319674 A1 | 12/2012 | El-Essawy et al. | |
| 2013/0099775 A1 | 4/2013 | Mitsuya | |

FOREIGN PATENT DOCUMENTS

| | | | | |
|---|---|---|---|---|
| JP | 06174753 A | * | 6/1994 | G01R 15/02 |
| JP | H09281146 A | | 10/1997 | |
| WO | WO2009042414 A2 | | 4/2009 | |

OTHER PUBLICATIONS

U.S. Appl. No. 13/451,515, filed Apr. 19, 2012, Carpenter, et al.
U.S. Appl. No. 13/024,181, filed Feb. 9, 2011, Carpenter, et al.
U.S. Appl. No. 13/451,524, filed Apr. 19, 2011, Carpenter, et al.
U.S. Appl. No. 13/159,536, filed Jun. 14, 2012, El-Essawy, et al.
U.S. Appl. No. 13/159,554, filed Jun. 14, 2012, El-Essawy, et al.
Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.
Silicon Chip, "Current Clamp Meter Adapter for DMMs", issue 180, published Sep. 12, 2003.
Ziegler, et al., "Current Sensing Techniques: A Review", IEEE Sensors Journal, Apr. 2009, pp. 354-376 vol. 9, No. 4. Piscataway, NJ.
McKenzie, et al. "Non-contact Voltage Measurement using Electronically Varying Capacitance", Electronics Letters, Feb. 4, 2010, vol. 46, No. 3, UK.
U.S. Appl. No. 13/024,199, Feb. 9, 2011, Carpenter, et al.
"AC Current sensor with Interface" downloaded from: http://www.electronicspoint.com/ac-current-sensor-interface-t221239.html on Jun. 10, 2011.
"Smart Current Signature Sensor" downloaded from http://technology.ksc.nasa.gov/successes/SS-SmartCurrent-Signal-Snsr.htm on Jun. 10, 2011.
Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 24, 2011.
Valuetesters.com on-line catalog: "non-contact voltage probes", downloaded from http://valuetesters.com/Voltage-Probe-Non-contact.php on May 24, 2011.
Clarke, John. "Current Clamp Meter Adapter for DMMs", Silicon Chip, 9 pages (pp. 1-9 in pdf), issue 180, published Sep. 12, 2003.
McKenzie, et al. "Non-contact Voltage Measurement Using Electronically Varying Capacitance", Electronics Letters, Feb. 4, 2010, 2 pages (pp. 1-2 in pdf), vol. 46, No. 3, UK.
"AC Current sensor with Interface" downloaded from: http://www.electronicspoint.com/ac-current-sensor-interface-t221239.html on Jun. 10, 2011, 4 pages (pp. 1-4 in pdf).
"Smart Current Signature Sensor" downloaded from http://technology.ksc.nasa.gov/successes/SS-Smart-Current-Signal-Snsr.htm on Jun. 10, 2011, 2 pages (pp. 1-2 in pdf).
Dwyer, Daniel, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 25, 2011, 10 pages (pp. 1-10 in pdf).
Valuetesters.com on-line catalog: "non-contact voltage probes", downloaded from http://valuetesters.com/Voltage-Probe-Non-contact.php on May 25, 2011, 5 pages (pp. 1-5 in pdf).

* cited by examiner

FLEXIBLE CURRENT AND VOLTAGE SENSOR

BACKGROUND OF THE INVENTION

1. Field of the Invention

The present invention is related to sensors providing input to power measurement systems, and more specifically to a flexible non-contact electromagnetic current sensor that can be used to detect the current conducted by a wire of a power distribution system.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load.

In order to determine current delivered to loads in an AC power distribution system, and in particular in installations already in place, current sensors are needed that provide for easy coupling to the high voltage wiring used to supply the loads, and proper isolation is needed between the power distribution circuits/loads and the measurement circuitry.

However, in actual installations, insertion of current sensors may be difficult due to dense wire packing, and further, installation of current sensors in a live panel requires the use of insulating gloves that make it difficult to perform fine work with the fingers.

Therefore, it would be desirable to provide a flexible sensor that can be easily installed around a wire to provide isolated current draw information and permit load characteristics to be measured in an AC power distribution system.

BRIEF SUMMARY OF THE INVENTION

The invention is embodied in a sensor for measuring a current passing through a wire, and may also sense the voltage on the wire, and the method of operation of the sensor.

The sensor includes at least one flexible ferromagnetic strip that is affixed to a current sensing device at a first end. The second end is secured to the other side of the current sensing device or to another flexible ferromagnetic strip extending from the other side of the current sensing device to form a loop providing a closed pathway for magnetic flux.

A voltage sensor may be provided by metal foil affixed to the inside of the flexible ferromagnetic strip. A clamp body, which can be a spring loaded handle operated clamp or a locking fastener, can secure the ferromagnetic strip around the wire.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses sensors for current and voltage sensing features for providing input to power measurement systems that provide for ease of installation, in particular when the installer is wearing insulating gloves and in which the installation is made in a crowded wiring box. For example, the present invention can be installed in a main power distribution box for a computer server room, in which a large number of branch circuits distribute power to various electronic chassis power supplies, and in which it is beneficial to provide power usage information for the various branch circuits to power monitoring and/or system control utilities within a computer operating environment. Other applications include power monitoring for commercial and/or residential energy management.

Figure 1A:
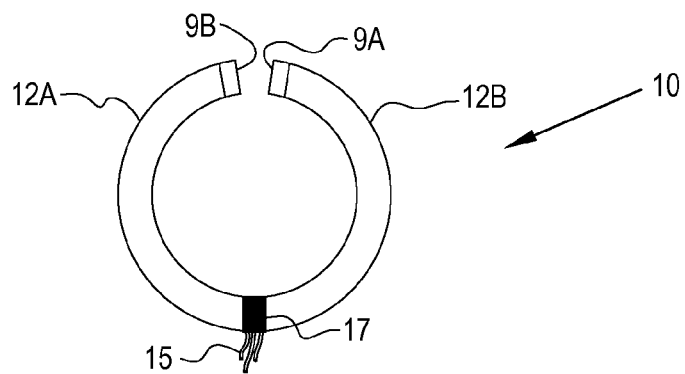
FIG. 1A is an end view and FIG. 1B is isometric view of a current sensor according to an embodiment of the present invention.
Figure 1B:
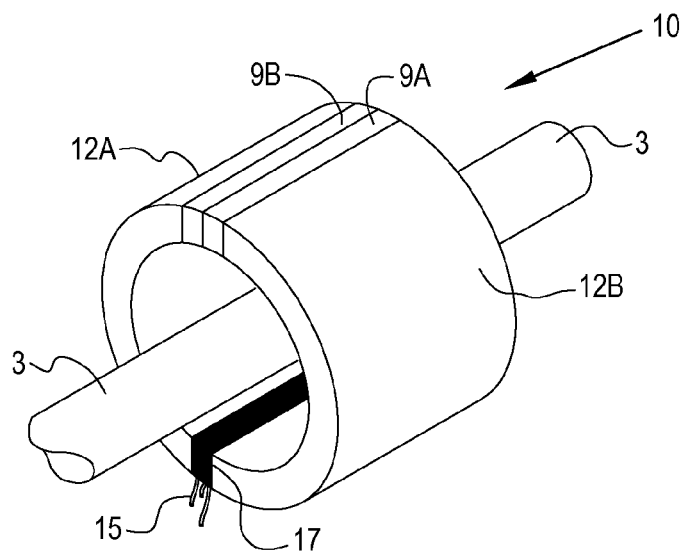

Referring now to FIGS. 1A-1B, a sensor 10 in accordance with an embodiment of the present invention is shown. Flexible ferromagnetic strip segments 12A and 12B are affixed to the sides of a current sensing element 17, which is generally a magnetic field sensor, such as a Hall effect sensor, current sensing transformer, anisotropic magnetoresistance (AMR) sensor, ordinary magnetoresistance (CMR) sensor, giant magnetoresistance (GMR) sensor, or other suitable current-sensing device. Current sensing element 17 is shown as having interface wires 15 extending from its body, but other types of terminals may be used as an alternative manner of providing connections to current sensing element 17. Current sensing element 17 provides information about a magnitude and phase of a current passing through a wire 3 around which flexible ferromagnetic strip segments 12A, 12B are wrapped and secured with a securing material, such as a hook and loop fastener arrangement with a hook portion 9B affixed to an end of ferromagnetic strip segment 12A and a loop portion 9A affixed to an end of ferromagnetic strip segment 12B, which provides for detachable fastening of sensor 10 around wire 3. Alternatively, the securing material may be an adhesive, such as a paper-backed double-sided adhesive material affixed to one or both ends of ferromagnetic strip segments 12A, 12B. In either case, the securing material layers should be made as thin as possible, since ferromagnetic strip segments 12A, 12B are provided to form a conduction loop for magnetic flux, with a gap defined by current sensing element 17 which senses the magnetic flux to measure the current passing through wire 3. Therefore, a second gap is defined by securing material 9A, 9B which should be made as small as possible in order to improve the signal-to-noise ratio at the output of current sensing element 3. In accordance with alternative embodiments of the invention, one of ferromagnetic strip segments 12A, 12B could be replaced with a non-flexible ferrite material of appropriate shape, so that the remaining flexible strip is sufficient to provide for closure around wire 3. Thus, the sensing loop provided by the present invention includes at least a portion formed by a flexible ferrite material, but can include non-flexible ferrite, as well as gaps between the ferrite materials, between the ferrite materials and sensor, etc.

Figure 1C:
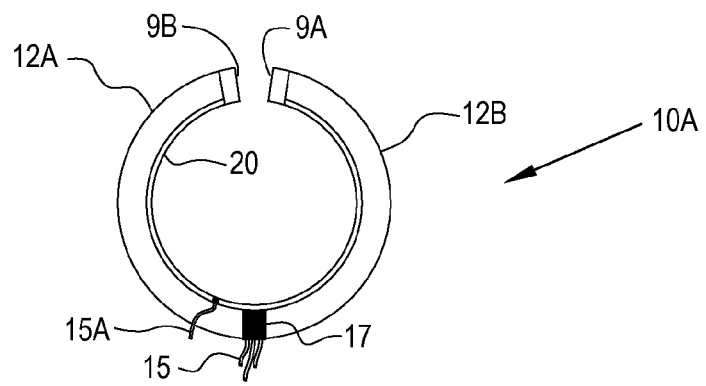
FIG. 1C is an end view of a current and voltage sensor according to another embodiment of the present invention.

Referring now to FIG. 1C, a sensor 10A, in accordance with another embodiment of the invention is shown. Sensor 10A is similar to sensor 10 of FIGS. 1A-1B, so only differences between sensor 10A and sensor 10 will be described below. Sensor 10A includes the current-sensing features of sensor 10, but additionally includes a voltage sensing element 20 provided by a metal foil, which may be plated onto, formed within, or adhered to the inner surface of flexible ferromagnetic strip segments 12A, 12B. Voltage sensing element 20 provides capacitive coupling to branch circuit wire 3 and provides an output via an interface wire 15A, which may also alternatively be replaced with a terminal or other suitable electrical connector. Voltage sensing element 20 provides an AC waveform that is at least indicative of the phase of the voltage on wire 3 and may be calibrated to provide an indication of the magnitude of the voltage if needed.

Figure 2A:
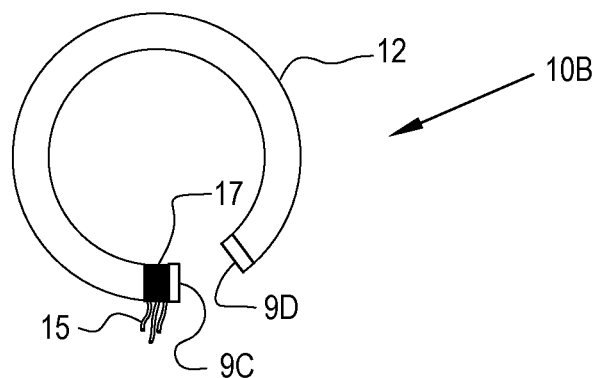
FIG. 2A is an end view and FIG. 2B is isometric view of a current sensor according to another embodiment of the present invention.
Figure 2B:
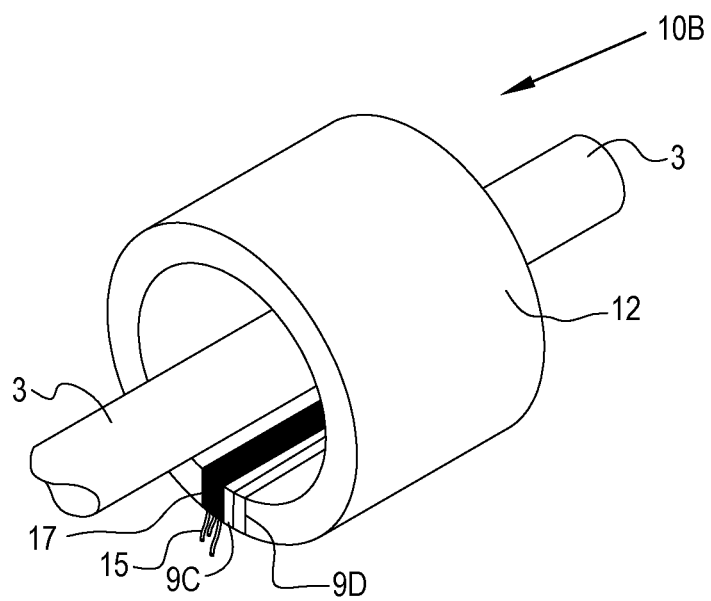

Referring now to FIGS. 2A and 2B, a sensor 10B in accordance with another embodiment of the invention is shown. Sensor 10B is similar to sensor 10 of FIGS. 1A-1B, so only differences between them will be described below. Rather than including current sensing element 17 between two different segments of flexible ferrite material to form the flexible ferrite strip, sensor 10B uses a single continuous flexible ferrite strip 12. Current sensing element is then affixed to an end of flexible ferrite strip 12, and securing material 9C and/or securing material 9D are affixed to the current sensing element 17 and/or the end of flexible ferrite strip 12 opposite current sensing element 17, respectively. Securing material 9C and/or 9D, may be of the same materials and/or structures as disclosed above for securing material 9A and 9B with reference to FIGS. 1A-1C. While not shown in the Figure, a metal foil providing a voltage sensing element 20 can additionally be disposed on the inside of sensor 10B to provide voltage sensing functionality.

Figure 3A:
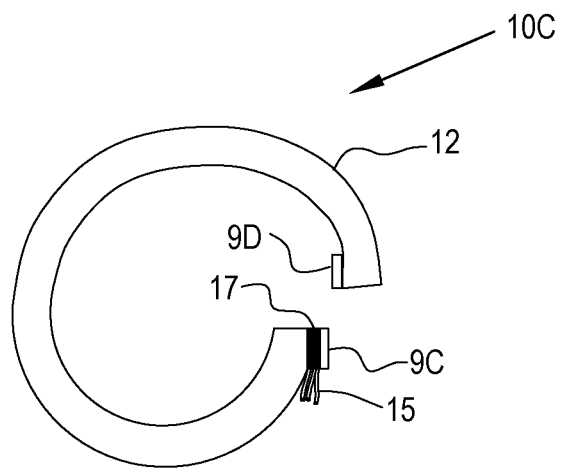
FIG. 3A is an end view and FIG. 3B is isometric view of a current sensor according to still another embodiment of the present invention.
Figure 3B:
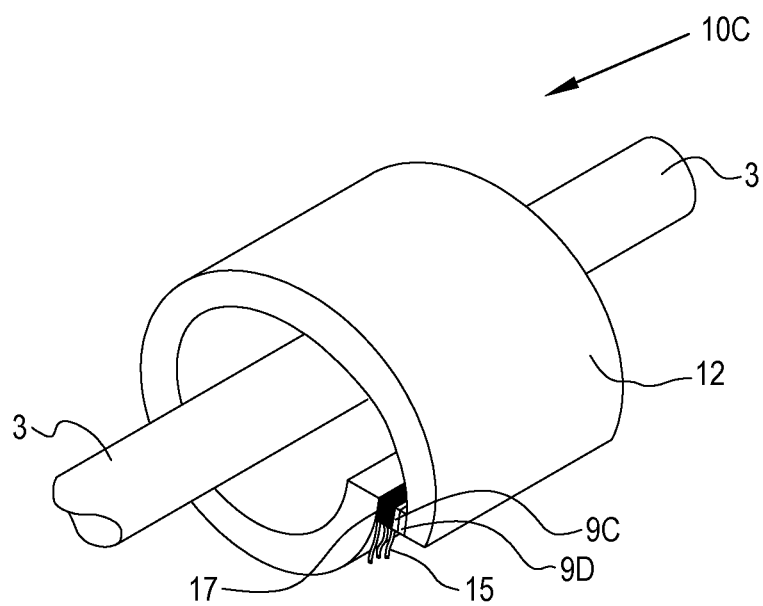

Referring now to FIGS. 3A and 3B, a sensor 10C in accordance with yet another embodiment of the invention is shown. Sensor 10C is similar to sensor 10B of FIGS. 2A-2B, so only differences between them will be described below. Rather than affixing a side of current sensing element 17 to an end of flexible ferrite strip 12, current sensing element is affixed to the outside (or alternatively inside) surface of flexible ferrite strip 12 at an end of flexible ferrite strip 12. The opposing face at the other end of flexible ferrite strip 12 is held in proximity to current sensing element by one or both of securing material 9C, 9D, which is affixed to the other side of current sensing element 17 and/or the opposing face of flexible ferrite strip 12. While not shown in the Figure, a metal foil providing a voltage sensing element 20 can additionally be disposed on the inside of sensor 10C to provide voltage sensing functionality.

Figure 4:
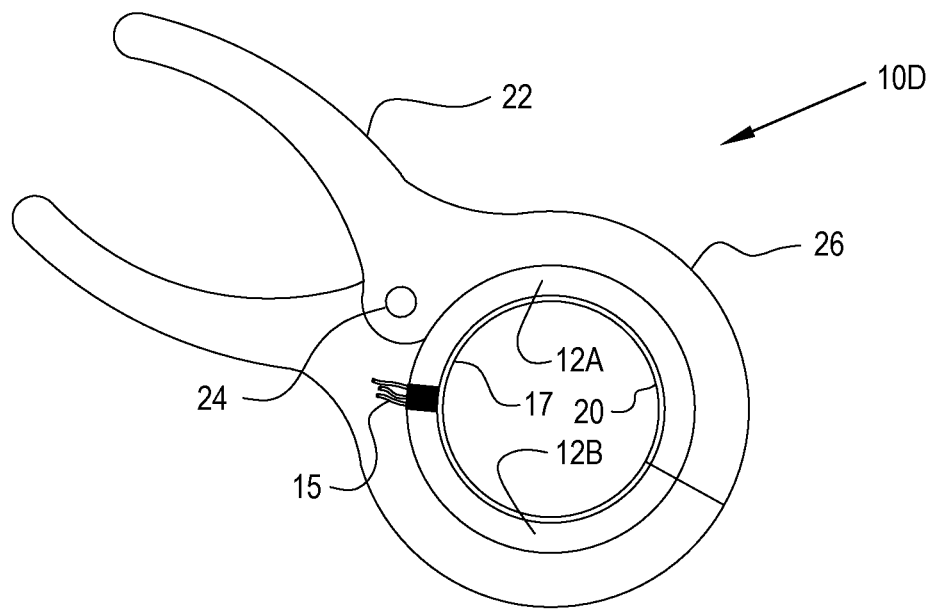
FIG. 4 is a side view of a current and voltage sensor according to another embodiment of the present invention.

Referring now to FIG. 4, a sensor 10D, in accordance with another embodiment of the invention is shown. Sensor 10D is similar to sensor 10A of FIG. 1C, so only differences between sensor 10D and sensor 10A will be described below. Sensor further includes a clamp body 20 that includes handle portions 22 at a proximal end, and at the distal end defines an aperture in which flexible ferromagnetic strip segments 12A, 12B, current sensing element 17, and voltage sensing element 20 are disposed. When handle portions 22 are compressed together, the aperture opens, flexing flexible ferromagnetic strip segments 12A, 12B and voltage sensing element 20 and permitting one or more wires to be introduced to sensor 10D. When handle portions 22 are released the ends of flexible ferromagnetic strip segments 12A, 12B opposite current sensing element make contact, closing the magnetic flux sensing loop formed by flexible ferromagnetic strip segments 12A, 12B and current sensing element 17.

Figure 5:
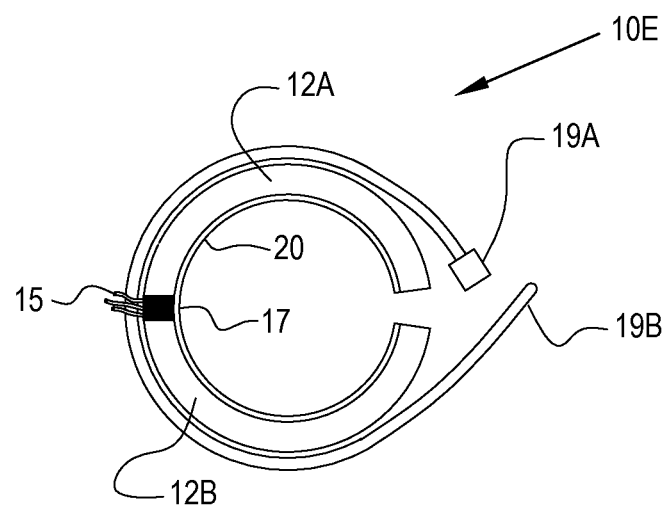
FIG. 5 is a side view of a current and voltage sensor according to yet another embodiment of the present invention.

Referring now to FIG. 5, a sensor 10E, in accordance with another embodiment of the invention is shown. Sensor 10E is similar to sensor 10A of FIG. 1C, so only differences between sensor 10D and sensor 10A will be described. A sensor body is provided in sensor 10E by a locking pull-tie 19B affixed to flexible ferrite strip segments 12A,12B and having a locking mechanism 10A so that sensor 10E can be permanently secured around one or more wires. In accordance with alternative embodiments of the invention, locking mechanism 19A can be releasable to provide for removal and relocation of sensor 10E. Locking mechanism 10A may be provided by such structures as hook-and-loop fasteners (e.g., VELCRO, which is a trademark of Velcro Industries, B.V.), zip-ties or other cable ties, and may include bases with fastening fixtures, such as self-adhesive backers.

Figure 6:
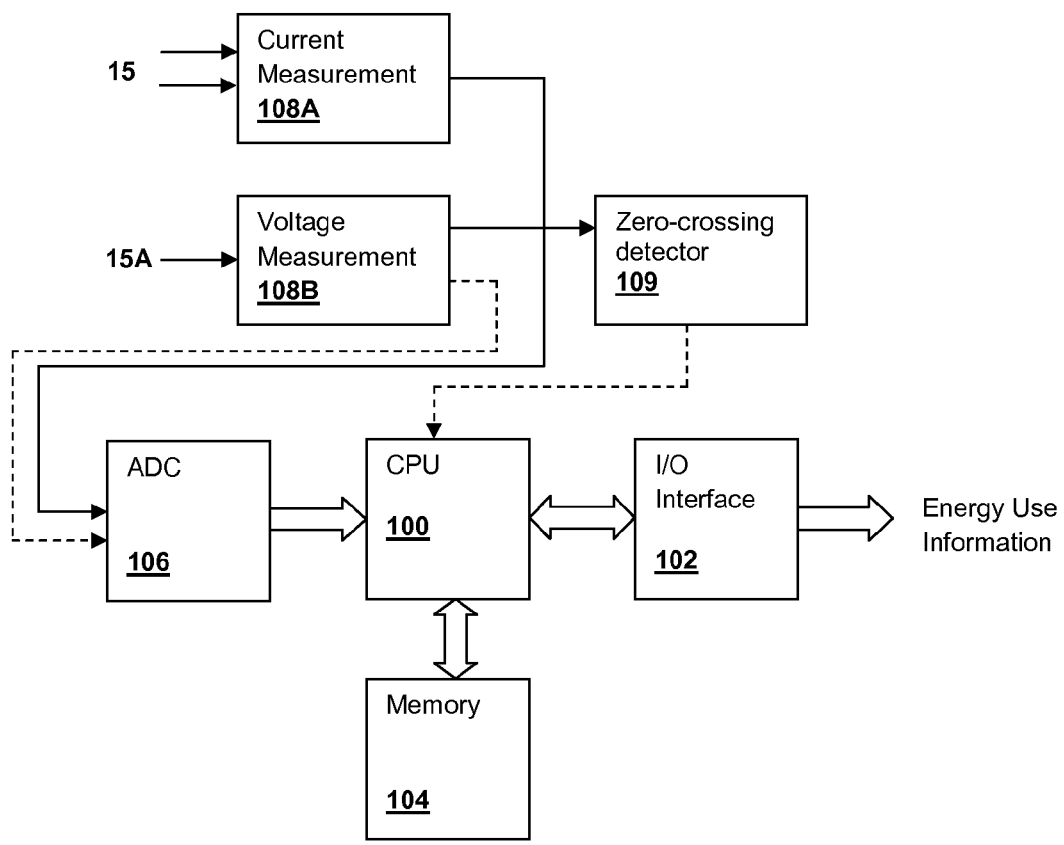
FIG. 6 is an electrical block diagram illustrating circuits for receiving inputs from sensors according to embodiments of the present invention.

Referring now to FIG. 6, a circuit for receiving input from the current/voltage sensors of FIGS. 1A-1C, 2A-2B, 3A-3B, 4 and 5 is shown in a block diagram. Interface wires 15 from current sensing element 17 provide input to a current measurement circuit 108A, which is an analog circuit that appropriately scales and filters the current channel output of the sensor. Interface wires 15 also supply current to current sensing element 17, if needed. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 100. Alternatively, current measurement circuit 108A may be omitted and current sensing element 17 may be connected directly to ADC 106. The power usage by the circuit associated with a particular sensor can be determined by assuming that the circuit voltage is constant (e.g., 115 Vrms for electrical branch circuits in the U.S.) and that the phase relationship between the voltage and current is aligned (i.e., in-phase). However, while the assumption of constant voltage is generally sufficient, as properly designed properly distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit.

Interface wire 15A from the voltage channel of the sensor is provided to a voltage measurement circuit 108B, which is an analog circuit that appropriately scales and filters the voltage channel output of the sensor. A zero-crossing detector 109 may be used to provide phase-only information to a central processing unit 100 that performs power calculations, alternatively or in combination with providing an output of voltage measurement circuit to an input of ADC 106. Alternatively, voltage measurement circuit 108B may be omitted and interface wire 15A connected directly to ADC 106. An input/output (I/O) interface 102 provides either a wireless or wired connection to a local or external monitoring system. When power factor is not taken into account, the instantaneous power used by each branch circuit can be computed as:

$$P_{BRANCH} = V_{rms} * I_{meas}$$

where $V_{rms}$ is a constant value, e.g. 115V, and $I_{meas}$ is a measured rms current value. Power value $P_{BRANCH}$ may be integrated over time to yield the energy use. When the phase of the voltage is known, then the power may be computed more accurately as:

$$P_{BRANCH} = V_{rms} * I_{meas} * \cos(\Phi)$$

where $\Phi$ is a difference in phase angle between the voltage and current waveforms. The output of zero-crossing detector 109 may be compared with the position of the zero crossings in the current waveform generated by current measurement circuit 108A and the time $\Delta T$ between the zero crossings in the current and voltage used to generate phase difference $\Phi$ from the line frequency (assuming the line frequency is 60 Hz):

$$\Phi = 2\pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sensor for sensing a current passing through a wire of a power distribution system, the sensor comprising:
   a current sensing device for providing a first output indicative of the current passing through the wire; and
   a flexible ferromagnetic strip having the current sensing device affixed at an end thereof for forming a closed pathway for magnetic flux when the sensor is coupled to the wire, wherein a first side of the current sensing device is affixed to a first end of the flexible ferromagnetic strip, and wherein a second end of the ferromagnetic strip abuts a second side of the current sensing device to form the closed pathway through the current sensing device when the sensor is coupled to the wire, further comprising at least one securing material affixed to one of the second end of the ferromagnetic strip or the second side of the current sensing device to secure the second end of the ferromagnetic strip to the second side of the current sensing device.

2. The sensor of claim 1, further comprising a voltage sensing device affixed to the flexible ferromagnetic strip for providing a second output indicative of the electric potential on the wire, wherein the voltage sensing device does not make electrical contact with the wire.

3. The sensor of claim 2, wherein the voltage sensing device comprises a metal foil having substantially a same width and a same length as the flexible ferromagnetic strip.

4. The sensor of claim 1, wherein a first side of the current sensing device is affixed to an inside surface at the first end of the flexible ferromagnetic strip, and wherein an opposing outside surface at the second end of the ferromagnetic strip abuts a second side of the current sensing device to form the closed pathway through the current sensing device.

5. The sensor of claim 4, wherein the at least one securing material is affixed to one of the inside surface at the second end of the ferromagnetic strip or the second side of the current sensing device to secure the outside surface at the second end of the ferromagnetic strip to the second side of the current sensing device.

6. A method of sensing a current passing through a wire of a power distribution system, the method comprising:
   securing a flexible ferromagnetic strip having a current sensing device affixed at an end thereof around the wire to form a closed pathway for magnetic flux including the current sensing device, wherein the securing secures a single flexible ferromagnetic strip having a first side of the current sensing device affixed at a first end thereof, and second side of the current sensing device abutted to the ferromagnetic strip at a second end thereof to form the closed pathway through the current sensing device when the sensor is coupled to the wire, wherein the securing is performed by at least one securing material affixed at one of the second end of the first ferromagnetic strip or the second end of the second ferromagnetic strip to secure the second end of the first ferromagnetic strip at the second end of the second ferromagnetic strip; and
   measuring an output of the current sensing device to provide an indication of the instantaneous value of the current.

7. The method of claim 6, wherein the securing further secures a voltage sensing device affixed to the flexible ferromagnetic strip for providing a second output indicative of the electric potential on the wire, wherein the voltage sensing device does not make electrical contact with the wire.

8. The method of claim 7, wherein the securing secures a voltage sensing device comprising a metal foil having substantially a same width and a same length as the flexible ferromagnetic strip.

9. A sensor for sensing a current passing through a wire of a power distribution system, the sensor comprising:
   a current sensing device for providing a first output indicative of the current passing through the wire;
   a sensor clamp body for securing the sensor to the wire, wherein the flexible ferromagnetic strip and the current sensing device are disposed within the sensor clamp body;
   a flexible ferromagnetic strip having the current sensing device affixed at an end thereof for forming a closed pathway for magnetic flux when the sensor is coupled to the wire;
   a pair of handles disposed at a proximal end of the sensor clamp body; and
   a hinge mechanism, and wherein the flexible ferromagnetic strip is disposed within an aperture formed at a distal end of the sensor clamp body, wherein the pair of handles, when compressed together, open the aperture to permit insertion of the wire, wherein the hinge mechanism includes a restoring spring to close the aperture around the wire when the pair of handles is released, wherein the flexible strip is disposed along an inside circumference of the aperture and secured to the sensor clamp body, and wherein when the aperture is open, the flexible ferromagnetic strip separates only at a distal end of the aperture, whereby the flexible ferromagnetic strip flexes at a proximal end of the aperture when the pair of handles is compressed together or released.

* * * * *